(12) United States Patent
De Jager et al.

(10) Patent No.: US 7,684,009 B2
(45) Date of Patent: *Mar. 23, 2010

(54) LITHOGRAPHIC APPARATUS AND DEVICE MANUFACTURING METHOD

(75) Inventors: Pieter Willem Herman De Jager, Rotterdam (NL); Cheng-Qun Gui, Best (NL); Peter Spit, Lantau Island (CN); Eduard Hoeberichts, Mol (BE)

(73) Assignee: ASML Netherlands B.V., Veldhoven (NL)

( * ) Notice: Subject to any disclaimer, the term of this patent is extended or adjusted under 35 U.S.C. 154(b) by 552 days.

This patent is subject to a terminal disclaimer.

(21) Appl. No.: 11/647,426

(22) Filed: Dec. 29, 2006

(65) Prior Publication Data

US 2007/0109510 A1 May 17, 2007

Related U.S. Application Data

(63) Continuation of application No. 10/880,435, filed on Jun. 30, 2004, now Pat. No. 7,158,208.

(51) Int. Cl.
*G03B 27/52* (2006.01)
(52) U.S. Cl. .......................................... 355/30; 355/53
(58) Field of Classification Search .................... 355/30, 355/53
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,463,459 | A | 10/1995 | Morioka et al. |
| 5,500,736 | A | 3/1996 | Koitabashi et al. |
| 5,523,193 | A | 6/1996 | Nelson |

(Continued)

FOREIGN PATENT DOCUMENTS

EP 0 991 959 B1 6/2004

(Continued)

OTHER PUBLICATIONS

Translation of Search Report for Taiwan Patent Application No. 094120332, 2 pgs.

(Continued)

*Primary Examiner*—Edward J Glick
*Assistant Examiner*—Steven H Whitesell-Gordon
(74) *Attorney, Agent, or Firm*—Sterne, Kessler, Goldstein & Fox P.L.L.C (57) ABSTRACT

A lithographic apparatus and method in which an illumination system supplies a projection beam, a patterning system imparts to the beam a pattern in its cross section, and a projection system projects the patterned beam onto a target portion of a substrate. The projection system comprises an array of lenses spaced from the substrate such that each lens in the array focuses part of the patterned beam onto the substrate. A displacement system causes displacement between the lens array and the substrate. A particle detector detects particles on the substrate which are approaching the lens array. A free working distance control system increases the spacing between the lens array and the substrate in response to detection of a particle. The lens array is moved away from the substrate as the detected particle passes the lens array. Thus damage to the lens array can be avoided.

21 Claims, 5 Drawing Sheets

U.S. PATENT DOCUMENTS

| | | |
|---|---|---|
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,016,185 A | 1/2000 | Cullman et al. |
| 6,133,986 A | 10/2000 | Johnson |
| 6,177,980 B1 | 1/2001 | Johnson |
| 6,496,257 B1 | 12/2002 | Taniguchi et al. |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,158,208 B2 | 1/2007 | De Jager et al. |
| 2001/0021015 A1* | 9/2001 | Morioka et al. .......... 356/237.5 |
| 2004/0041104 A1 | 3/2004 | Liebregts et al. |
| 2004/0130561 A1 | 7/2004 | Jain |

FOREIGN PATENT DOCUMENTS

| | | |
|---|---|---|
| EP | 1 482 375 A2 | 12/2004 |
| JP | 59-152626 A | 8/1984 |
| JP | 5-326376 A | 12/1993 |
| JP | 9-260257 A | 10/1997 |
| WO | WO 97/34171 A2 | 9/1997 |
| WO | WO 98/33096 A1 | 7/1998 |
| WO | WO 98/38597 A2 | 9/1998 |
| WO | WO 2005/085956 A2 | 9/2005 |

OTHER PUBLICATIONS

Office Action mailed Jan. 26, 2006 for U.S. Appl. No. 10/880,435 filed Jun. 30, 2004, 9 pgs.

Notice of Allowance mailed Jun. 27, 2006 for U.S. Appl. No. 10/880,435 filed Jun. 30, 2004, 5 pgs.

Notice of Allowance mailed Aug. 15, 2006 for U.S. Appl. No. 10/880,435 filed Jun. 30, 2004, 2 pgs.

Notice of Allowance mailed Sep. 25, 2006 for U.S. Appl. No. 10/880,435 filed Jun. 30, 2004, 2 pgs.

English Translation of Japanese Office Action for Patent Application No. 2005-189555 mailed Sep. 9, 2008, 3 pgs.

English Abstract of Japanese Publication No. JP 2001-500628 published Jan. 16, 2001, 1 pg.

English abstract of Japanese Patent Publication No. 59-152626 A, 1 page.

European Search Report, dated Apr. 25, 2006, for European Patent Application No. 05253429.4, 4 pages.

* cited by examiner

LITHOGRAPHIC APPARATUS AND DEVICE MANUFACTURING METHOD

This application is a continuation of prior application Ser. No. 10/880,435, filed on Jun. 30, 2004, and included herein by reference in its entirety.

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

The patterned beam is projected onto the target potion of the substrate by a projection system including a series of lens components. In one arrangement, an array of lenses (also referred to as a lens array) is positioned adjacent the substrate with each lens in the array of lenses being arranged to focus a respective part of the patterned beam onto the substrate as a single illumination "dot." This arrangement is normally referred to as a microlens array or MLA systems. In order for the pattern of dots projected by the lens array to be scanned across the substrate, relative displacement as between the microlens array and the substrate is required. Generally, but not necessarily, this is achieved by displacing the substrate beneath a static lens array.

The resolution of the pattern projected by the mircolens array, that is the smallest dimension of a feature which can be represented in the pattern, is proportional to the wavelength of the patterned beam, and inversely proportional to the numerical aperture (NA) of the lens system. That smallest dimension is generally referred to as the critical dimension (CD), and typically may be in the range of 1 to 2 micrometers, or smaller.

In an MLA system, the numerical aperture is a function of the angle subtended at the substrate by radiation focused onto the substrate by a respective lens in the lens array. That subtended angle is sometimes referred to as the "opening angle." Thus, for a given numerical aperture, (e.g., typically in the range of about 0.06 to 0.25), the required minimum diameter of each lens in the lens array is a function of the spacing between the lens array and the substrate onto which the lens array projects the patterned beam. That spacing is generally referred to as the "free working distance." The greater the free working distance, the greater the diameter of each lens in the lens array, and therefore the greater the minimum pitch of lenses in the array. Achieving higher numerical apertures requires either larger lenses (and a resultant larger pitch), or smaller free working distance, or a combination of the two.

Typically, the free working distance between the lens array and the substrate is a few hundred micrometers, for example in the range 200 to 800 micrometers. In MLAs it is desirable to provide arrays of 256×256 to 1024×1024 lenses in an area of 127×127 mm$^2$ (e.g., the effective area of a 200 mm substrate). Given such dimensions, a maximum possible lens pitch in the array is typically in the range 124 micrometers (127 mm/1024) to 496 micrometers (127 mm/256).

In order to achieve higher resolutions, it is desirable to operate with relatively small free working distances. In an MLA, the lens array may be displaceable towards and away from the substrate to maintain the actual array/substrate spacing at the designed free working distance. In normal circumstances, there is little risk of potentially damaging contact occurring between the lens array and the substrate.

In flat panel display technology environments, a substrate may be large, for example a large glass panel of the order of 2 meters square, and will generally be thin, for example of the order of 700 micrometers. With such large thin panels there is a real risk of debris, for example particles of glass or other materials, being present on the substrate. For instance, if the substrate has been coated with a resist prior to its exposure in the lithographic apparatus, it can be difficult to clean all such contaminants from the substrate. If a particle that is larger than the free working distance between the substrate and the lens array is present on the substrate, it will contact the lens array as the substrate is advanced beneath the lens array, and as a result, will cause damage to the substrate, leading generally to the rejection of the damaged substrate. Of greater significance is that such a particle collision may well scratch or cause other damage to the lenses of the array. Such an event would necessitate replacement of the lens array, which is a time consuming and expensive maintenance issue.

Therefore, what is needed is a lithographic system and method that eliminate or substantially reduce damage to lens arrays by contaminants.

SUMMARY OF THE INVENTION

An embodiment of the present invention provides a lithographic apparatus comprising an illumination system for supplying a projection beam of radiation, a patterning system serving to impart to the projection beam a pattern in its cross-section, a substrate table for supporting a substrate, a projection system for projecting the patterned beam onto a target portion of the substrate. The projection system comprises an array of lenses located at a spacing from the substrate, such that each lens in the array focuses a respective part of the patterned beam onto the substrate. The lithographic apparatus also comprises a displacement system to cause relative displacement between the lens array and the substrate, a particle detector positioned to detect particles on the substrate which are approaching the lens array as a result of relative displacement between the lens array and the substrate, and a free working distance control system. The free working distance control system increases the spacing between the lens array and the substrate in response to detection of a particle by the detector, such that the lens array is moved away from the substrate as relative displacement causes the detected particle to pass the lens array.

Another embodiment of the present invention provides a lithographic device manufacturing method comprising the steps of providing a substrate on a substrate table, providing a projection beam of radiation using an illumination system, imparting to the projection beam a pattern in its cross-section, and projecting the patterned beam onto a target portion of the substrate through an array of lenses. The array of lenses are located at a spacing from the substrate such that each lens in the array focuses a respective part of the patterned beam onto the substrate. Relative displacement is caused between the lens array and the substrate, such that particles on the substrate that are approaching the lens array as a result of relative displacement between the lens array and the substrate are detected by a particle detector. The spacing between the lens array and the substrate is increased in response to detection of a particle such that the lens array is raised clear of the detected particle as relative displacement causes the detected particle to pass the lens array.

In these embodiment, raising the lens array out of harms way when a article is detected avoids damage to the lens array.

In one example, the lens array may be part of an optical engine that is displaced as a unit to increase the array/substrate spacing, or only the lens array of the optical engine may be displaced. In one example, two or more separate optical engines may be independently controlled so that only the engine aligned with the detected particle in the direction of relative displacement is moved to increase the lens array/substrate spacing.

In one example, a pellicle may be arranged between the lens array and the substrate to reduce the risk of damage to and contamination of the lens array.

In one example, a cleaning device may be located upstream of the detector to clear displaceable particle off the substrate.

In one example, the patterned beam may be produced in any appropriate manner, for example using a mask or reticle, or using an array of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAIL DESCRIPTION OF THE EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
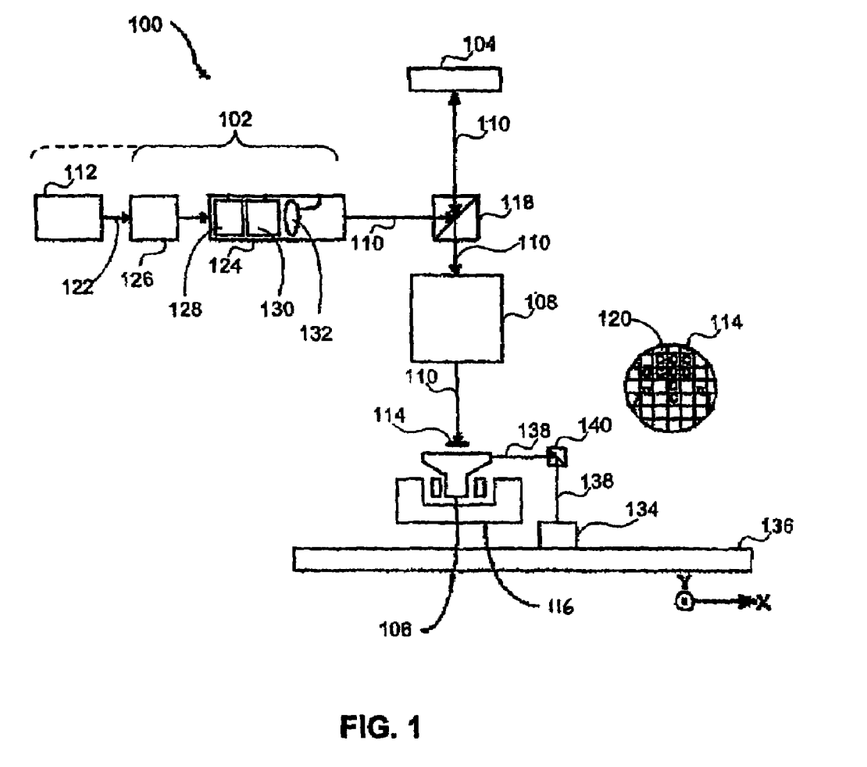
FIG. 1 schematically depicts a lithographic projection apparatus of a type to which the present invention may be applied.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 maybe used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Exemplary Lithographic Apparatus Including a Lens Array

Figure 2:
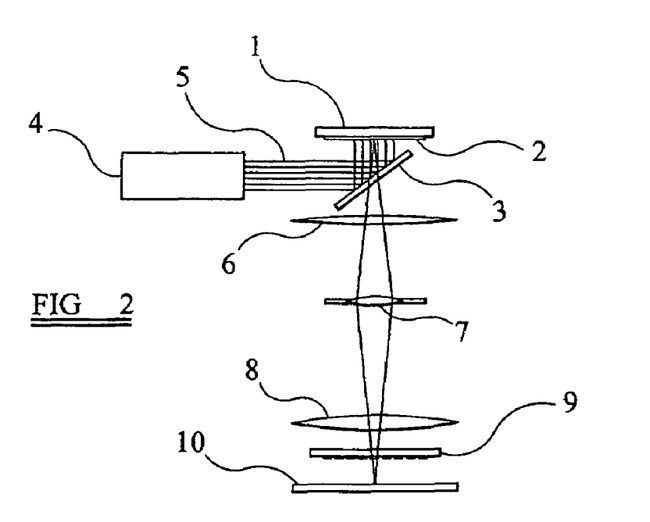
FIG. 2 schematically depicts a lithographic apparatus of the general type illustrate in FIG. 1, which incorporates an array of lenses adjacent a substrate to be exposed, according to one embodiment of the present invention.

FIG. 2 schematically depicts a lithographic apparatus of the general type illustrate in FIG. 1 that incorporates an array of lenses adjacent a substrate to be exposed, according to one embodiment of the present invention. The lithographic apparatus comprises a contrast device 1. An underside surface of contrast device 1 supports a two dimensional array of elements 2. In one example, an angular position of each of element in array 2 is selectively controlled. A beam splitter 3 is positioned beneath contrast device 1. An illumination source 4 directs a beam of radiation 5 towards beam splitter 3. Beam of radiation 5 is reflected onto the underside surface of contrast device 1. One of the elements in array 2 of the contrast device 1 is shown as reflecting a part of beam 5 back through beam splitter 3 and projection optics defined by lenses 6, 7, and 8. A lowermost lens 8 is a field lens, which produces a substantially telecentric beam that is directed towards a microlens array 9. Microlens array 9 comprises a two dimensional array of small lenses, each of which is arranged so as to focus light incident upon it onto an upper surface of a substrate 10. Thus, for each of elements in array 2 in contrast device 1 that acts as a mirror reflecting light to microlens array 9, a respective one of the lenses in microlens array 9 is illuminated, and a respective spot of light is projected by that lens in microlens array 9 onto the upper surface of substrate 10.

Figure 3:
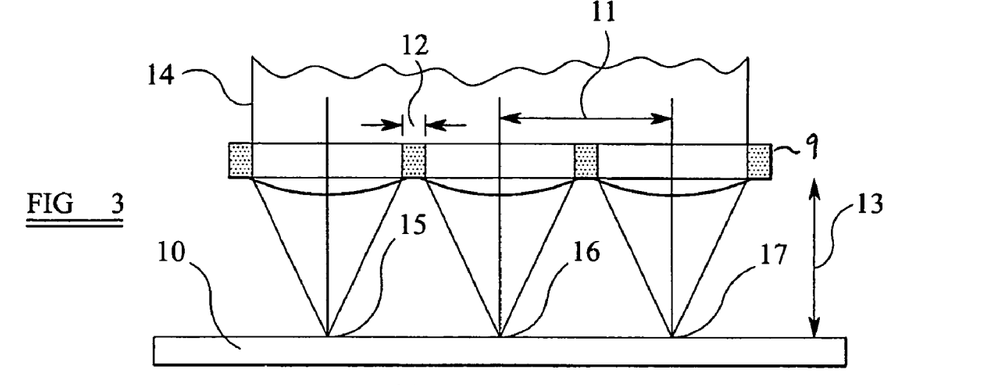
FIG. 3 schematically illustrates three lenses of the lens array shown in FIG. 2, according to one embodiment of the present invention.

FIG. 3 schematically illustrates three lenses of the lens array shown in FIG. 2, according to one embodiment of the present invention. The Figure also shows a disposition of lens array 9 relative to substrate 10 in the apparatus illustrated in FIG. 2. It is to be appreciated that lens array 9 will include a plurality of rows and columns of individual lenses, although FIG. 3 shows only three lenses in one row of lens array 9. In this example, a pitch between adjacent lenses, as represented by arrow 11, may be about 100 micrometers, a spacing between adjacent lenses, as represented by arrow 12, may be about 20 micrometers, and a free working distance of the lenses of lens array 9 from substrate 10, as represented by arrow 13, may be about 260 micrometers. It is to be appreciated these ranges are merely exemplary, and other ranges are contemplated within the scope of the present invention. With the lenses in the position relative to substrate 10 as illustrated, an incoming beam of radiation 14 is focused into three spots 15, 16 and 17 on the surface of substrate 10. In order to expose a desired pattern on the surface of substrate 10, relative movement has to be produced between array 9 and substrate 10. In one example, the movement is achieved through displacement of substrate 10 beneath array 9.

Figure 4:
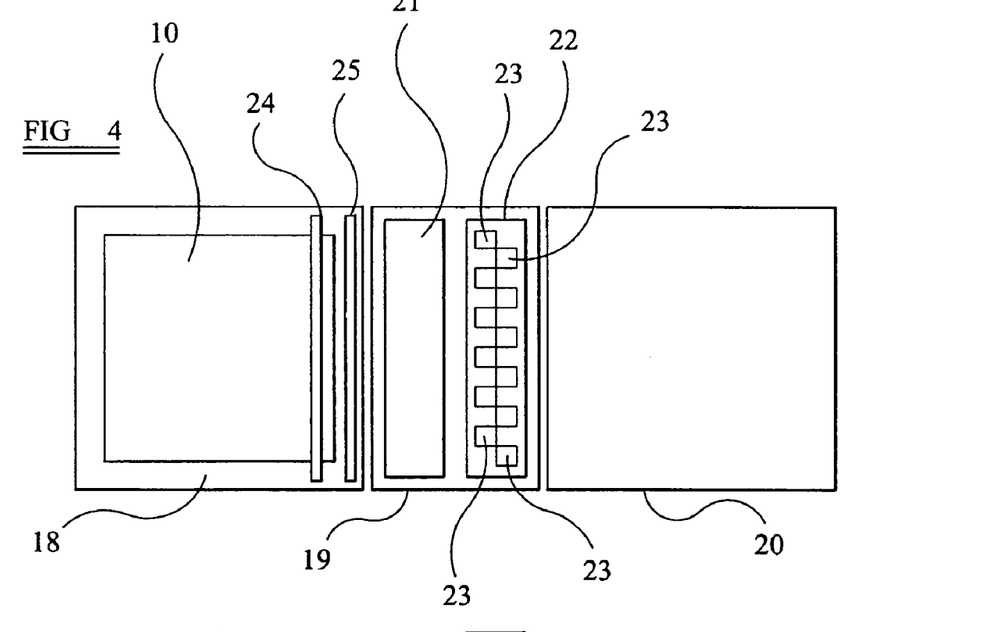
FIGS. 4 and 5 are top and side views, respectively, showing an array of optical engines each having the features of the apparatus illustrated in FIG. 2, according to one embodiment of the present invention.
Figure 5:
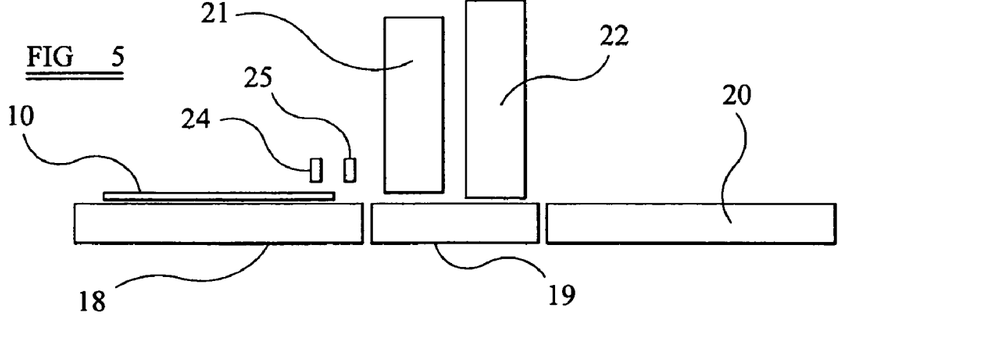

FIGS. 4 and 5 are top and side views, respectively, showing an array of optical engines each having the features of the apparatus illustrated in FIG. 2, according to one embodiment of the present invention. An apparatus in FIGS. 4 and 5 may be used to displace a large substrate beneath a series of optical engines, each of which incorporates a lens array, such as lens array 9 shown in FIG. 3. In the apparatus shown in FIGS. 4 and 5, substrate 10 is displaced from a first static table 18, across a second central static table 19, and onto a third static table 20. In one example, substrate 10 may be a large glass panel, for example about 2.15 m by about 1.85 m, which is suitable for forming flat panel display devices. Arranged above central table 19 is a metrology frame 21, which supports sensors (not shown) used to detect the position of substrate 10 relative to table 19 and an optical engine frame 22, which supports a series of twelve separate optical engines 23, each of which is represented by a simple square (see FIG. 4). An air cleaning device 24 and a particle detection unit 25 are mounted above first table 18. Air cleaning device 24 is located upstream of particle detection unit 25 in the direction of relative movement between substrate 10 and particle detection unit 25. Thus, only particles that are not removed by air cleaning device 24 are detected by detection unit 25.

It will be appreciated that the three separate tables 18, 19 and 20 as illustrated in FIGS. 4 and 5 could be replaced by a single table. Similarly, although twelve optical engines 23 are shown in FIGS. 4 and 5, this is only exemplary and a different number of engines 23 could be provided.

In one example, each of the optical engines 23 corresponds to a unit such as that illustrated in FIG. 2. Thus, each optical engine 23 incorporates its own microlens array 9. In one example, the focus, alignment, and magnification of each optical engine 23 can be separately adjusted. A full width of substrate 10 is exposed in a single pass beneath the twelve optical engines 23, the exposure tracks of adjacent engines overlapping as necessary to produce the required pattern on substrate 10.

In one example, air cleaning device 24 directs a curtain of air across substrate 10 and away from optical engines 23. This will remove loose contaminants, but will not remove, for example, a particle (not shown) embedded in a layer of resist (not shown) deposited on substrate 10. In one example, each optical engine 23 can be separately controlled so as to adjust the free working distance between microlens array 9 of that engine and underlying substrate 10 to compensate for these particles.

Figure 6:
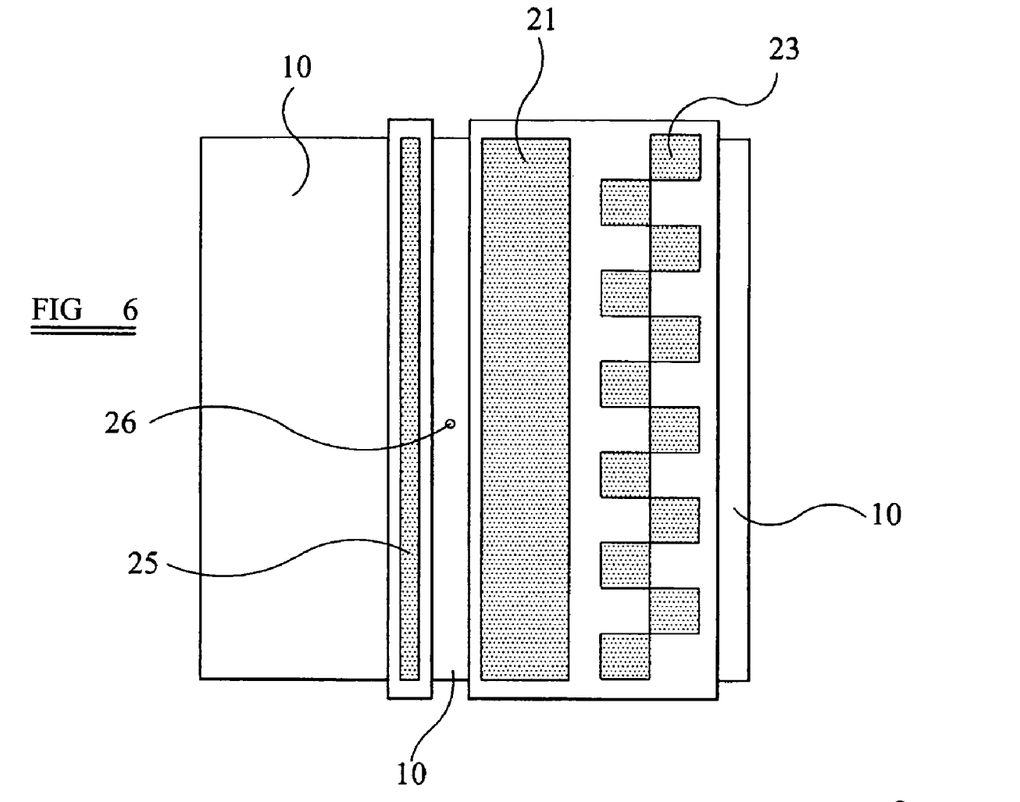
FIG. 6 is a more detailed representation of components shown in FIG. 4, according to one embodiment of the present invention.

FIG. 6 is a more detailed representation of components shown in FIG. 4, according to one embodiment of the present invention. FIG. 6 schematically represents substrate 10 passing beneath particle detector 25, metrology bridge 21, and an array of twelve of the optical engines 23. If a particle, as represented by spot 26 in FIG. 6, is detected, and a size of that particle is greater than the free working distance between substrate 10 and optical engine 23 aligned with the particle in the direction of movement of substrate 10, the respective optical engine 23 is raised upwards to increase the free working distance, and thereby to enable the particle to pass beneath lens array 9 of the respective optical engine 23 without causing any damage to lens array 9.

Figure 7:
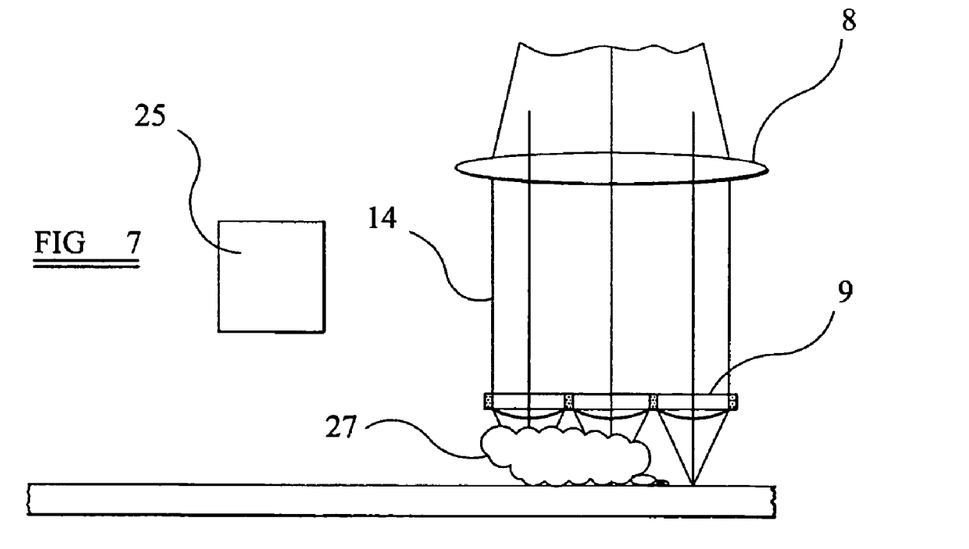
FIGS. 7 and 8 illustrate the displacement of a lens array in the event of detection of a large particle in the apparatus shown in FIG. 6, according to one embodiment of the present invention.
Figure 8:
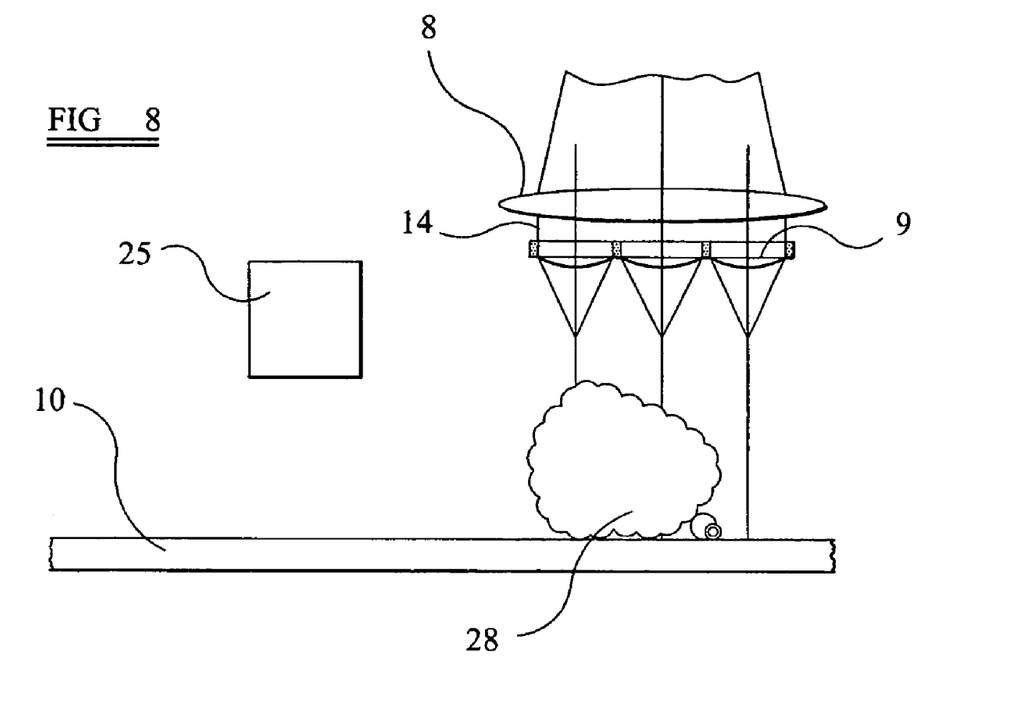

FIGS. 7 and 8 illustrate a displacement of lens array 9 in the event of detection of a large particle in the apparatus shown in FIG. 6, according to one embodiment of the present invention. FIGS. 7 and 8 illustrate a manner of operation.

In FIG. 7, particle 27 is sufficiently small as to be able to pass beneath lens array 9. This occurs while the spacing between lens array 9 and substrate 10 is the predetermined free working distance. At the predetermine free working distance each of the lenses in lens array 9 focuses a respective portion of an illuminating beam 14 on the surface of substrate 10.

In contrast, in the case illustrated in FIG. 8, a particle 28 is present on substrate 10 is so large that it would become trapped between lens array 9 and substrate 10 if the normal free working distance were to be maintained. Accordingly, as shown in FIG. 8, microlens array 9 is raised upwards away from substrate 10, so as to enable particle 28 to pass beneath array 9 in a safe manner. In one example, the entire optical engine 23 including lens array 9 will be raised upwards by about 2000 to 5000 micrometers. In another example, as is schematically represented in FIG. 8, just the lens array 9 may be raised upwards towards an adjacent lens 8 of the projection system. It is to be appreciated that once microlens array 9 is raised away from its normal position to the position represented in FIG. 8, microlens array 9 will no longer focus light on the surface of substrate 10 as required to form the desired pattern. This is likely to result in processed substrate 10 not being of acceptable quality, which represents a loss of production. However, loss of production is acceptable as compared to risking damage to microlens array 9 because such damage would require expensive and time consuming repair work. If a substrate 10 is being processed to produce, for example, 4, 6 or 9 flat panel display devices, a single particle on an area of substrate 10 related to one of the devices will only result in loss of that one device as processing can continue normally for the other devices.

Figure 9:
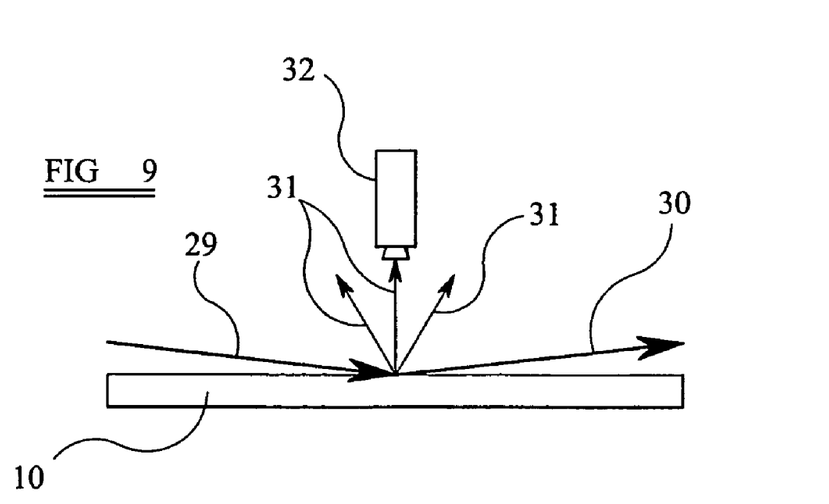
FIG. 9 illustrates in greater detail a particle detector used to control lens displacement, according to one embodiment of the present invention.

FIG. 9 illustrates in greater detail a particle detector used to control lens displacement, according to one embodiment of the present invention. In this embodiment, there is illustrated the principle of one approach to the detection of particles as required for the operation of the apparatus, as described with reference to FIGS. 7 and 8. In this embodiment, a laser beam 29 is directed at a glancing angle towards substrate 10, such that in normal circumstances (e.g., no surface imperfections or particles present) laser beam 29 will be reflected in the direction indicated by arrow 30. If a particle is present on the surface of substrate 10, light will be scattered from the particle as represented by arrows 31. The scattered light will be detected by a camera 32. An intensity of the scattered light being a function of a size of the particle. Thus, an output of camera 32 can be used to control raising upwards of microlens array lens 9 of respective optical engine 23 towards which the particle is being transported as a result of displacement of substrate 10 relative to lens array 9.

Figure 10:
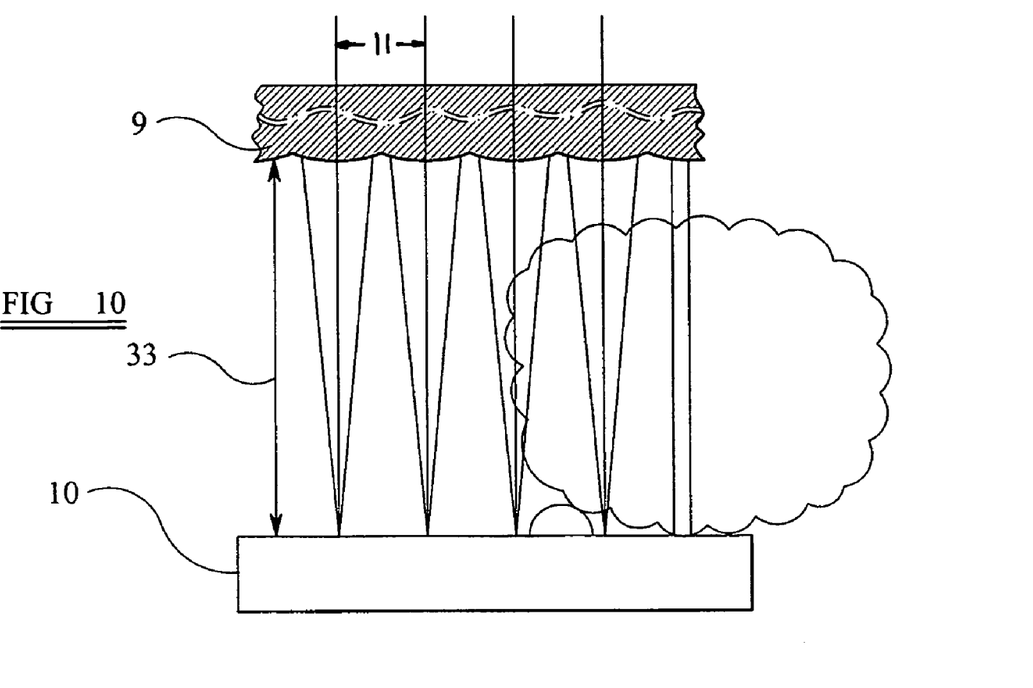
FIG. 10 illustrates a lens array and substrate arranged with a relatively large free working distance between the array and the substrate, according to one embodiment of the present invention.

FIG. 10 illustrates lens array 9 and substrate 10 arranged with a relatively large free working distance between lens array 9 and substrate 10, according to one embodiment of the present invention. FIG. 10 shows an arrangement in which the normal free working distance is increased by increasing the pitch of microlens array 9 to, for example, about 320 micrometers, as represented by arrow 11. In FIG. 10, substrate 10 is spaced from microlens array 9 by a free working distance indicated by arrow 33, which may be, for example, of on the order of about 800 micrometers. With such a free working distance, relatively large particles, such as the particle shown, can pass safely beneath the lens array 9, but it will still be necessary to raise up lens array 9 if a particle is detected that is too big to pass safely beneath lens array 9. Thus, a relatively large free working distance, as illustrated in FIG. 10, allows for the number of times lens array 9 has to be raised up to be reduced compared to the case illustrate in FIG. 7, thereby reducing lost production.

Figure 11:
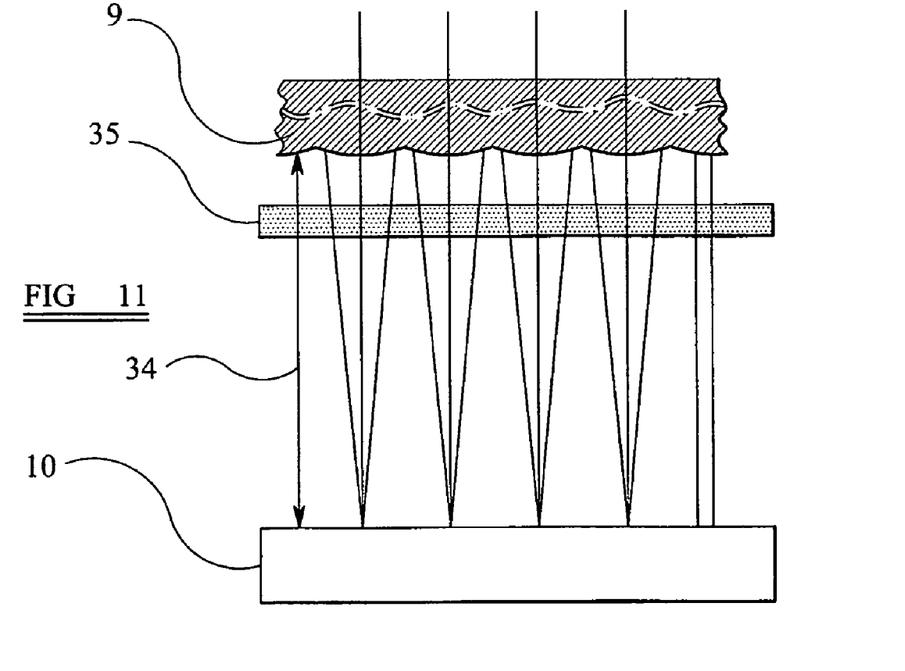
FIG. 11 illustrates the introduction of a pellicle between the lens array and substrate of FIG. 10, according to one embodiment of the present invention.

FIG. 11 illustrates the introduction of a pellicle 35 between lens array 9 and substrate 10 of FIG. 10, according to one embodiment of the present invention. The free working distance is relatively large, e.g. about 800 micrometers as represented by arrow 34. It is to be appreciated pellicle 35 can be of any size as would be application specific. Pellicle 35 may be, for example, a thin polymer film (e.g., the thickness of the order of about 1 micrometer) of the type used for photomask protection. The film could be stretched across a frame that is attached to lens array 9 and is raised upwards with lens array 9 in the event of detection of a particle. As an alternative to a polymer film, pellicle 35 could be in the form of a thin quartz plate. It is desirable for pellicle 35 to have characteristics of low absorbency, high transmission ratio, and good mechanical stability. Providing pellicle 35 allows for a reduction in the risk of a particle that has not been correctly detected damaging lens array 9, keeps lens array 9 free from molecular contamination, and can be replaced simply and cheaply as compared with replacing lens array 9 itself.

It is to be appreciated that in an alternative embodiment substrate 10 can be stationary and lens array 9 can move or be displaced in order to increase a spacing between them, so that a particle does not damage lens array 9.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   a displacement system that causes relative displacement between a lens array and a substrate to increase a spacing between the lens array and the substrate;
   a particle detector that detects particles on the substrate that are approaching the lens array as a result of relative displacement between the lens array and the substrate; and
   a free working distance control system that increases the spacing between the lens array and the substrate in response to detection of a particle by the particle detector, such that the lens array is moved away from the substrate using the displacement system as relative displacement causes the detected particle to pass below the lens array.

2. The apparatus of claim 1, wherein:
   the lens array is a component part of an optical engine; and
   the free working distance control system controls the position of the optical engine relative to the substrate.

3. The apparatus of claim 1, wherein:
   the lens array is a component part of an optical engine; and
   the free working distance control system controls the position of the lens array relative to other components of the optical engine.

4. The apparatus of claim 1, further comprising:
   at least two optical engines, each incorporating a lens array and a free working distance control system that controls the spacing between only the respective lens array and the substrate.

5. The apparatus of claim 1, further comprising:
   a pellicle located between the lens array and the substrate.

6. The apparatus of claim 1, further comprising:
a cleaning device that removes contaminants from the substrate, the cleaning device being positioned upstream of the particle detector in the direction of relative displacement between the lens array and the substrate.

7. The apparatus of claim 6, wherein the cleaning device removes the contaminants by directing air towards the substrate.

8. The apparatus of claim 1, wherein:
a substrate table holding the substrate and the lens array are stationary; and
the displacement system comprises a system that displaces the substrate across the substrate table beneath the lens array.

9. The apparatus of claim 1, wherein the free working distance control system is arranged to increase the spacing between the lens array to between about 2000 micrometers and about 5000 micrometers from between about 260 micrometers and about 800 micrometers.

10. The apparatus of claim 1, wherein the particle detector comprises:
a source of light directed at the substrate; and
a camera that detects scattering of the light when the light strikes the particle,
wherein intensity of the scattered light captured by the camera determines the presence of the particle.

11. The apparatus of claim 10, wherein the light source comprises a laser.

12. A lithographic device manufacturing method, comprising:
(a) displacing a lens array with respect to a substrate toward and away from each other;
(b) detecting a particle on the substrate that approaches the lens array as a result of step (a); and
(c) increasing the spacing between the lens array and the substrate in response to step (b), such that the lens array is moved away from the substrate until relative displacement causes the detected particle to pass the lens array.

13. The method of claim 12, further comprising:
(d) providing the lens array as part of an optical engine; and
(e) moving the optical engine relative to the substrate to increase the spacing between the lens array and the substrate.

14. The method of claim 12, further comprising:
(d) providing the lens array as part of an optical engine; and
(e) moving the lens array relative to other components of the optical engine to increase the spacing between the lens array and the substrate.

15. The method of claim 12, further comprising:
(d) using at least two optical engines each incorporating a lens array and a free working distance control system, wherein each free working distance control system controls only the spacing between the substrate and the lens array of a respective one of the at least two optical engines.

16. The method of claim 12, further comprising:
(d) mounting a pellicle between the lens array and the substrate.

17. The method of claim 12, further comprising:
(d) removing contaminants from the substrate before step (d) in the direction of relative displacement between the lens array and the substrate.

18. The method of claim 17, wherein the contaminants are removed by directing air towards the substrate.

19. The method of claim 12, wherein the spacing between the lens array and the substrate is increased to between about 2000 and about 5000 micrometers from between about 260 and about 800 micrometers.

20. The method of claim 12, wherein step (b) comprises:
(i) directing light at the substrate; and
(ii) detecting scattering of the light when the light strikes the particle,
wherein step (c) is performed when scattering at a predetermined intensity is detected.

21. The method of claim 20, wherein the light is produced by a laser.

* * * * *